US012279396B2

(12) United States Patent
Chuang

(10) Patent No.: US 12,279,396 B2
(45) Date of Patent: Apr. 15, 2025

(54) STORAGE ASSEMBLY AND SIDE MOUNTING ASSEMBLY

(71) Applicants:INVENTEC (PUDONG) TECHNOLOGY CORPORATION, Shanghai (CN); INVENTEC CORPORATION, Taipei (TW)

(72) Inventor: Kai Chuang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 134 days.

(21) Appl. No.: 18/207,041

(22) Filed: Jun. 7, 2023

(65) Prior Publication Data

US 2024/0314966 A1  Sep. 19, 2024

(30) Foreign Application Priority Data

Mar. 13, 2023 (CN) .......................... 202310244618.1

(51) Int. Cl.
*H05K 7/14* (2006.01)

(52) U.S. Cl.
CPC ................. *H05K 7/1489* (2013.01)

(58) Field of Classification Search
CPC .. H05K 7/1489; H05K 7/1411; H05K 7/1487; H05K 5/023; H05K 7/1409; H05K 7/14; G06F 1/187; G06F 1/181; G06F 1/186; H01R 13/62933; H01R 13/62977; G11B 33/124; G11B 33/122; G11B 33/0405; G11B 33/0461
See application file for complete search history.

(56) References Cited

U.S. PATENT DOCUMENTS

| 6,252,514 B1 * | 6/2001 | Nolan | G11B 33/128 361/170 |
| 6,288,902 B1 * | 9/2001 | Kim | G11B 33/08 206/707 |
| 7,027,309 B2 * | 4/2006 | Franz | H01R 13/62933 361/740 |

(Continued)

FOREIGN PATENT DOCUMENTS

TW    M410441 U  *  8/2011
TW    I586249    *  6/2017

(Continued)

*Primary Examiner* — Hiwot E Tefera
(74) *Attorney, Agent, or Firm* — Maschoff Brennan

(57) ABSTRACT

A storage assembly includes a cage, a circuit backplate, a tray and an auxiliary mounting linkage. The cage has a mounting space, an opening and a first pressed protruding portion. The opening is connected to the mounting space, and the first pressed protruding portion is located in the mounting space. The circuit backplate and the tray is disposed in the mounting space. The auxiliary mounting linkage includes a first link, a second link and a connecting link. The first link has a first end and a second end opposite to each other. The second link has a first end and a second end opposite to each other. The first ends are pivotally disposed on the tray. Two opposite ends of the connecting link are pivotally disposed on the second ends, respectively. Each of the first ends has an assembly protruding portion and a disassembly protruding portion.

7 Claims, 9 Drawing Sheets

(56) References Cited

U.S. PATENT DOCUMENTS

| | | | | |
|---|---|---|---|---|
| 10,485,123 | B1* | 11/2019 | Lin | H05K 5/0221 |
| 10,863,647 | B1* | 12/2020 | Escamilla | H05K 5/023 |
| 2005/0174743 | A1* | 8/2005 | Downing | H05K 7/1409 |
| | | | | 361/725 |
| 2011/0182006 | A1* | 7/2011 | Liao | H04Q 1/021 |
| | | | | 361/679.01 |
| 2011/0273850 | A1* | 11/2011 | Chen | H05K 5/023 |
| | | | | 292/336.3 |
| 2015/0288098 | A1* | 10/2015 | Kuo | G11B 33/122 |
| | | | | 439/343 |
| 2016/0064040 | A1* | 3/2016 | Hartman | H05K 7/1402 |
| | | | | 360/97.12 |
| 2017/0196107 | A1* | 7/2017 | Chen | F16M 13/022 |
| 2019/0059172 | A1* | 2/2019 | Gupta | G06F 1/187 |
| 2021/0373616 | A1* | 12/2021 | Chen | G06F 1/185 |
| 2022/0312621 | A1* | 9/2022 | Chang | H05K 7/1489 |
| 2024/0244785 | A1* | 7/2024 | Chuang | H05K 7/1489 |

FOREIGN PATENT DOCUMENTS

| | | | |
|---|---|---|---|
| TW | I705754 | B1 * | 9/2020 |
| TW | I780788 | * | 10/2022 |

* cited by examiner

STORAGE ASSEMBLY AND SIDE MOUNTING ASSEMBLY

CROSS-REFERENCE TO RELATED APPLICATIONS

This non-provisional application claims priority under 35 U.S.C. § 119(a) on Patent Application No(s). 202310244618.1 filed in China, on Mar. 13, 2023, the entire contents of which are hereby incorporated by reference.

BACKGROUND OF THE INVENTION

Technical Field of the Invention

The invention relates to a storage assembly, more particularly to a storage assembly capable of mounting a storage device horizontally.

Description of the Related Art

Nowadays, the information technology develops rapidly. Most of enterprises may do various tasks on the business via server, such as storing data. As the requirements of the functions of the server are increasing, there are more and more electronic components in the server.

However, when there are many electronic components in the server, the hard disk cannot be placed in the space inside the server according to the original placement method. In particularly, the hard disk can hardly be vertically placed in the space inside the server, which causes inconvenience for users in assembly. Therefore, how to improve the convenience of installing the hard disk in the server is an important issue to be solved.

SUMMARY OF THE INVENTION

The invention is to provide a storage assembly and a side mounting assembly which can improve the convenience for installing the hard disk in the server.

One embodiment of the invention provides a storage assembly, configured to install a storage device. The storage assembly includes a cage, a circuit backplate, a tray and an auxiliary mounting linkage. The cage has a mounting space, an opening and a first pressed protruding portion. The opening is connected to the mounting space, and the first pressed protruding portion is located in the mounting space. The circuit backplate is disposed on a side of the mounting space. The tray is configured to support the storage device, and is removably disposed in the mounting space via the opening. The tray can be moved out from the opening. The auxiliary mounting linkage includes a first link, a second link and a connecting link. The first link has a first end and a second end opposite to each other. The second link has a first end and a second end opposite to each other. The first end of the first link and the first end of the second link are pivotally disposed on the tray. Two opposite ends of the connecting link are pivotally disposed on the second end of the first link and the second end of the second link, respectively. Each of the first end of the first link and the first end of the second link has an assembly protruding portion and a disassembly protruding portion. When the assembly protruding portion of the first link and the assembly protruding portion of the second link press against the first pressed protruding portion of the cage, the first link and the second link force the tray to be moved toward the circuit backplate. When the disassembly protruding portion of the first link and the disassembly protruding portion of the second link press against the first pressed protruding portion of the cage, the first link and the second link force the tray to be moved away from the circuit backplate.

Another embodiment of the invention provides a side mounting assembly including a cage, a tray and an auxiliary mounting linkage. The cage has a mounting space, an opening and a first pressed protruding portion. The opening is connected to the mounting space, and the first pressed protruding portion is located in the mounting space. The tray is removably disposed in the mounting space via the opening. The auxiliary mounting linkage includes a first link, a second link and a connecting link. The first link has a first end and a second end opposite to each other. The second link has a first end and a second end opposite to each other. The first end of the first link and the first end of the second link are pivotally disposed on the tray. Two opposite ends of the connecting link are pivotally disposed on the second end of the first link and the second end of the second link, respectively. Each of the first end of the first link and the first end of the second link has an assembly protruding portion and a disassembly protruding portion. When the assembly protruding portion or the disassembly protruding portion of the first link and the assembly protruding portion or the disassembly protruding portion of the second link press against the first pressed protruding portion of the cage, the first link and the second link force the tray to be moved horizontally relative to the cage.

According to the storage assembly and the side mounting assembly disclosed by above embodiments, the first link and the second link of the auxiliary mounting linkage force the tray to be moved toward or away from the circuit backplate. That is, the first link and the second link of the auxiliary mounting linkage force the tray to be moved horizontally relative to the cage. Thus, the storage device can be installed on the circuit backplate more conveniently and with less force via the side mounting assembly when the storage device needs to be placed horizontally due to limited space. Therefore, the storage assembly and the side mounting assembly can improve the convenience of installing the storage device in the server.

BRIEF DESCRIPTION OF THE DRAWINGS

The present invention will become more fully understood from the detailed description given herein below and the accompanying drawings which are given by way of illustration only and thus are not limitative of the present invention and wherein.

DETAILED DESCRIPTION

Figure 1:
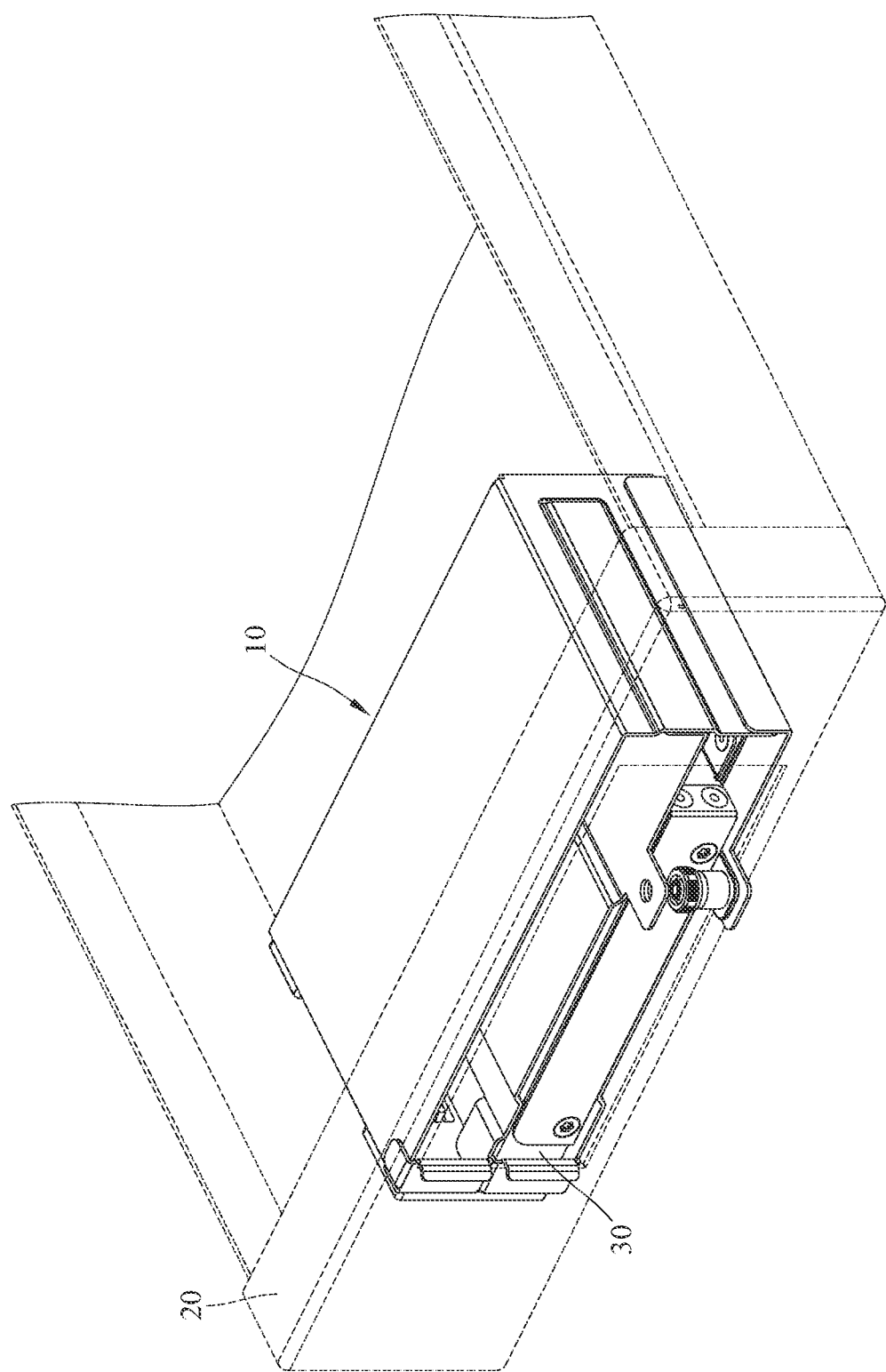
FIG. 1 is a perspective view of a the storage assembly located in the server casing in accordance with one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
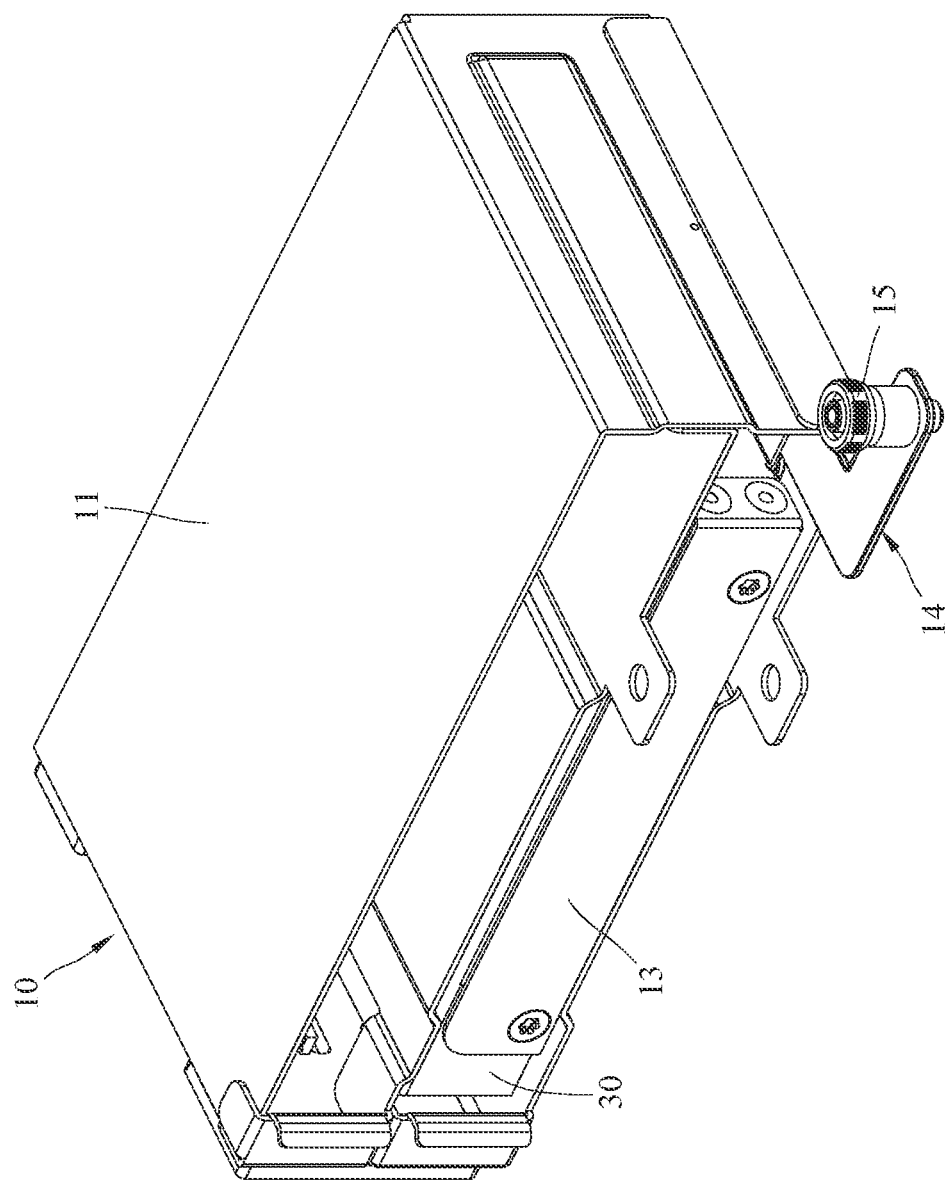
FIG. 2 is a perspective view of the storage assembly in FIG. 1.
Figure 3:
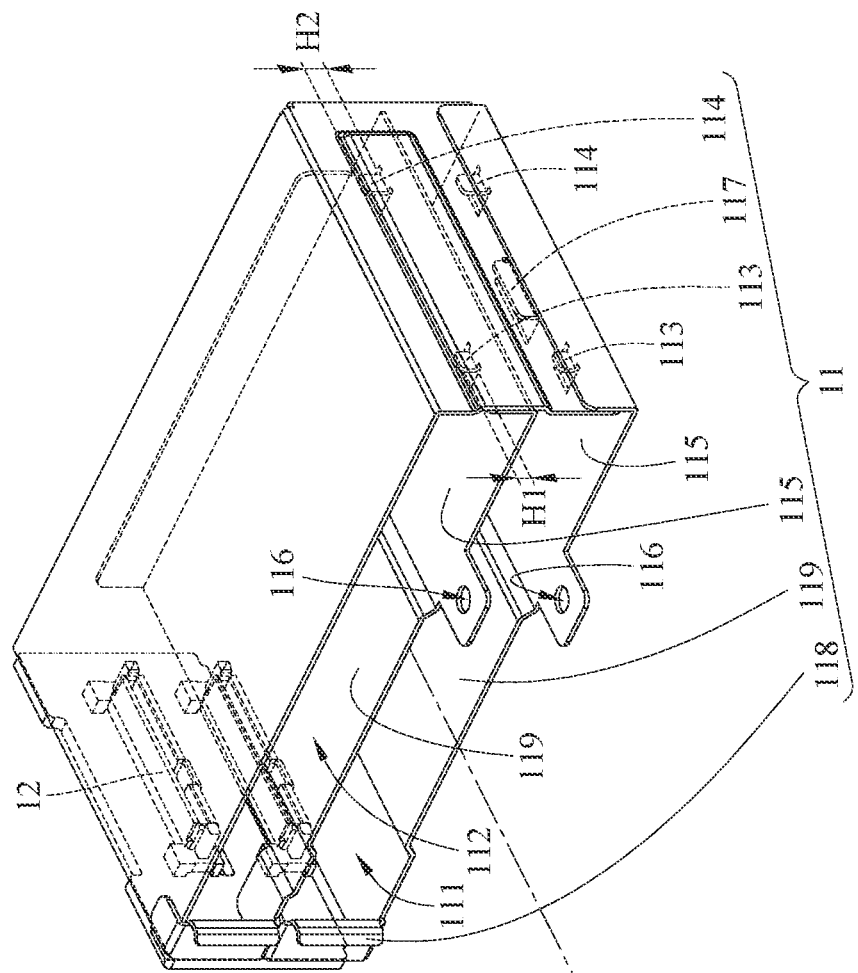
FIG. 3 is an exploded view of the storage assembly in FIG. 1.
Figure 3:
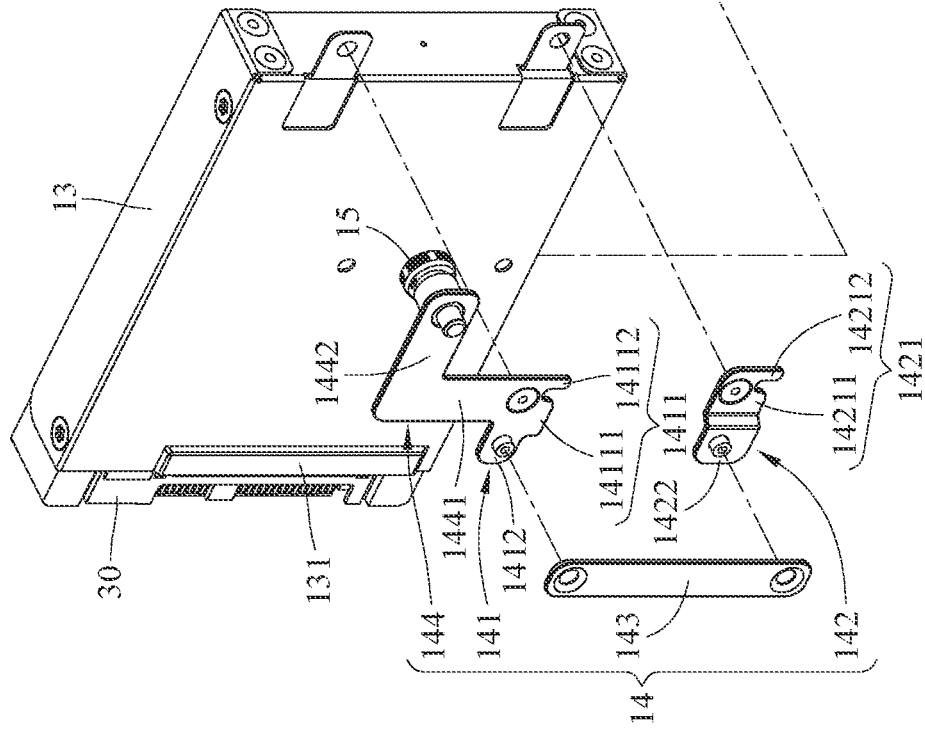

Please refer to FIG. 1 to FIG. 3, where FIG. 1 is a perspective view of a the storage assembly 10 located in the server casing 20 in accordance with one embodiment of the invention, FIG. 2 is a perspective view of the storage assembly 10 in FIG. 1, and FIG. 3 is an exploded view of the storage assembly 10 in FIG. 1.

In this embodiment, the storage assembly 10 is disposed in a server casing 20, and is configured to install a storage device 30. The storage device is, for example, a hard disk. The storage assembly 10 includes a cage 11, a circuit backplate 12, a tray 13 and an auxiliary mounting linkage 14. The cage 11 is partitioned into, for example, two layers. Take one of the layers as an example, the cage 11 includes a mounting space 111, an opening 112, a first pressed protruding portion 113, a second pressed protruding portion 114 and a supporting plate 115. The supporting plate 115 is configured to support the tray 13. The opening 112 is connected to the mounting space 111. The first pressed protruding portion 113 and the second pressed protruding portion 114 are located in the mounting space 111. The second pressed protruding portion 114 is located farther away from the opening 112 than the first pressed protruding portion 113, and a height H2 of the second pressed protruding portion 114 is larger than a height H1 of the first pressed protruding portion 113. The circuit backplate 12 is disposed on a side of the mounting space 111, and is configured for the storage device 30 to be plugged therein. The tray 13 is configured to install the storage device 30, and is removably disposed in the mounting space 111 via the opening 112.

Figure 4:
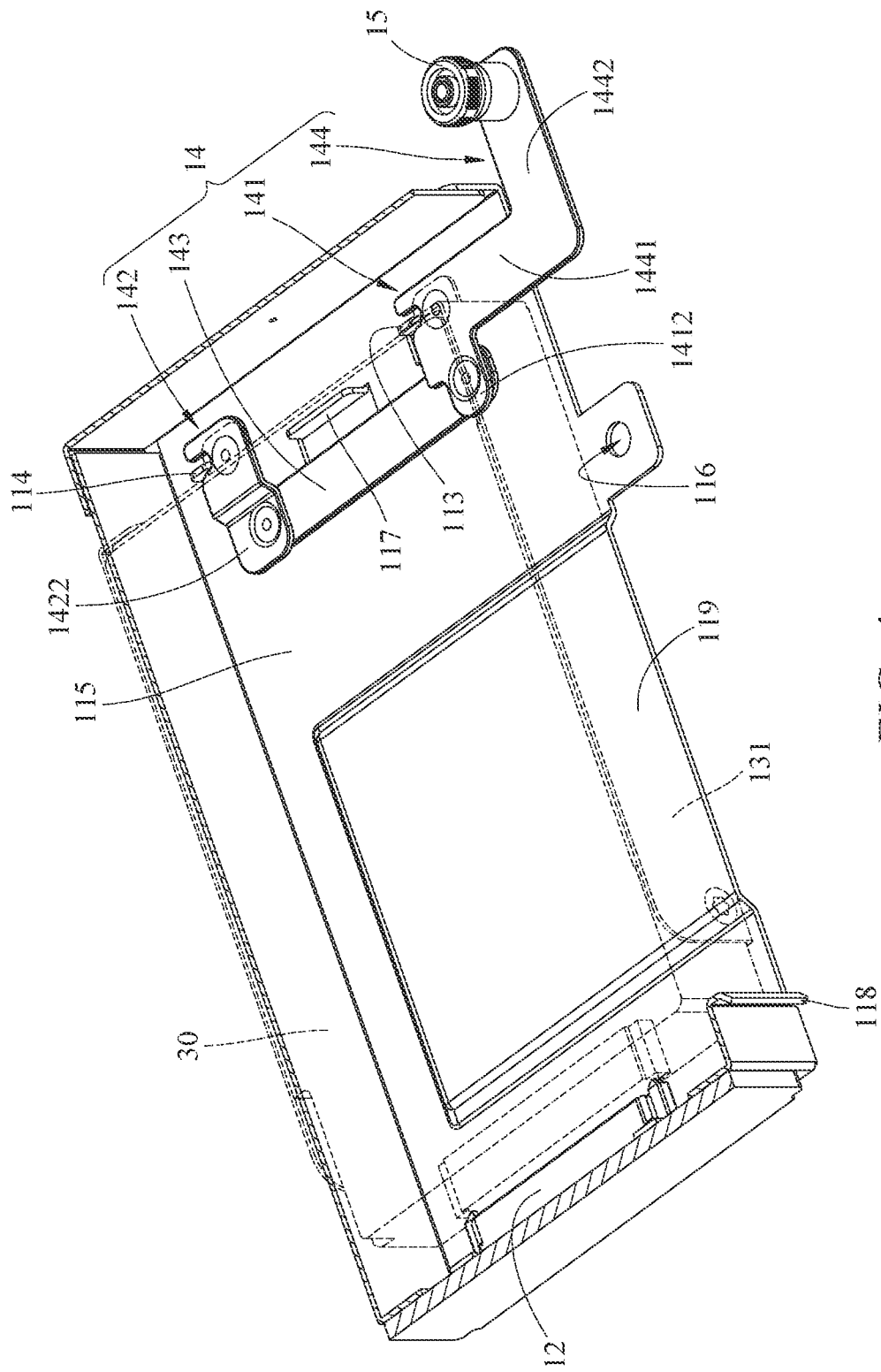
FIG. 4 is a cross-sectional view of the storage assembly in FIG. 1.
Figure 5:
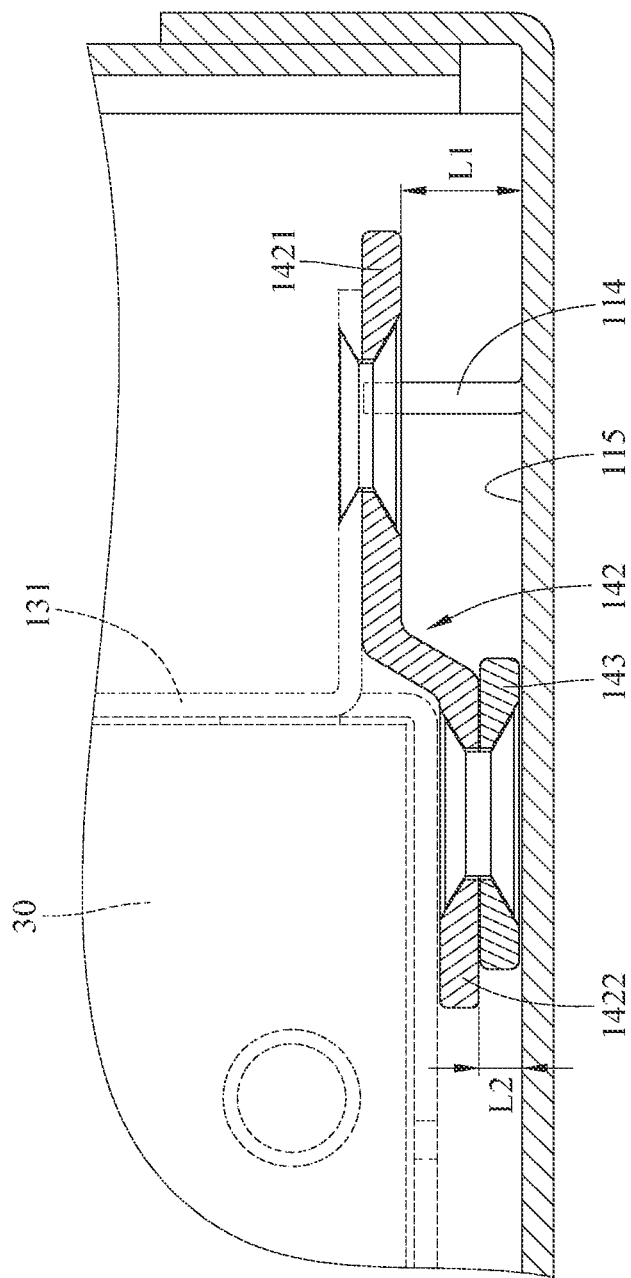
FIG. 5 is a cross-sectional view of a second link of the storage assembly in FIG. 3.
Figure 6:
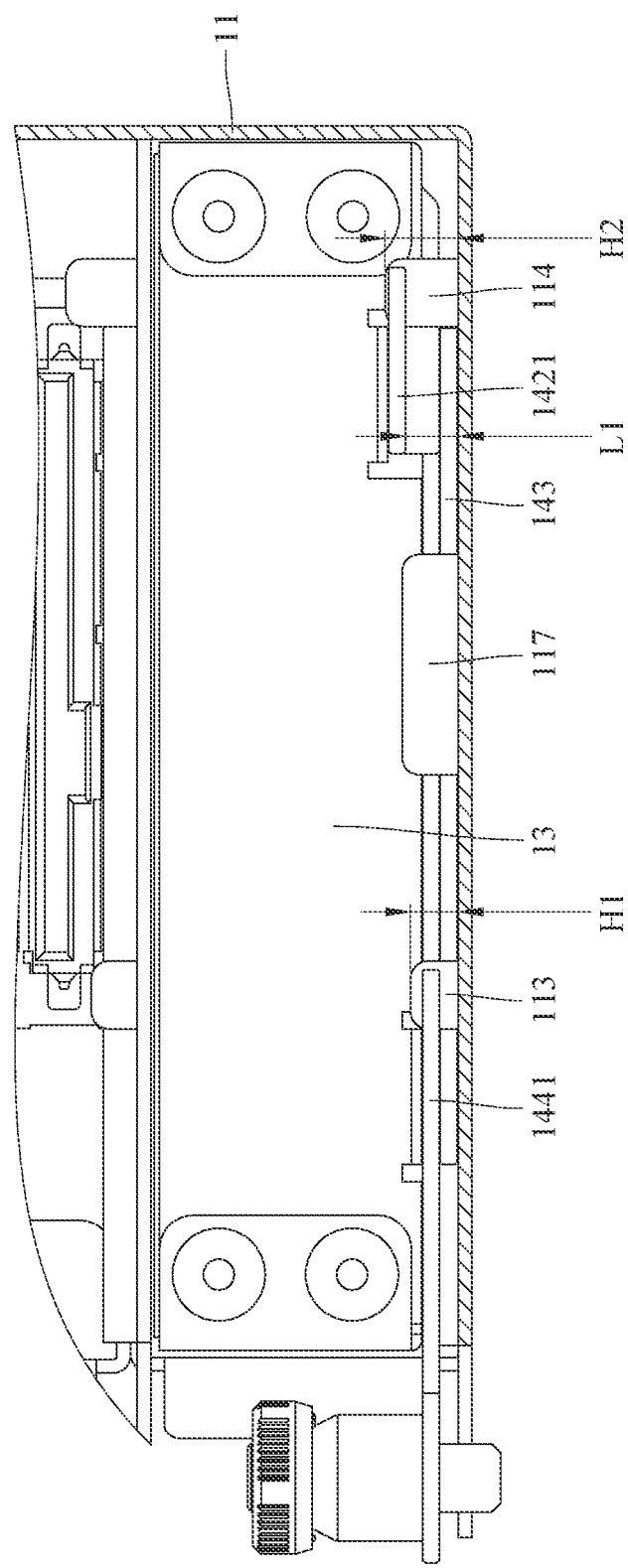
FIG. 6 is a cross-sectional view of a first link and the second link of the storage assembly in FIG. 3.

Please refer to FIG. 3 to FIG. 6, where FIG. 4 is a cross-sectional view of the storage assembly 10 in FIG. 1, FIG. 5 is a cross-sectional view of a second link 142 in FIG. 3, and FIG. 6 is a cross-sectional view of a first link 141 and the second link 142 in FIG. 3.

The auxiliary mounting linkage 14 includes a first link 141, a second link 142, a connecting link 143 and a handheld link 144. The first link 141 has a first end 1411 and a second end 1412 opposite to each other. The second link 142 has a first end 1421 and a second end 1422 opposite to each other. The first end 1411 of the first link 141 and the first end 1421 of the second link 142 are pivotally disposed on the tray 13. Two opposite ends of the connecting link 143 are pivotally disposed on the second end 1412 of the first link 141 and the second end 1422 of the second link 142, respectively. The first end 1411 of the first link 141 has an assembly protruding portion 14111 and a disassembly protruding portion 14112. The first end 1421 of the second link 142 has an assembly protruding portion 14211 and a disassembly protruding portion 14212. The assembly protruding portion 14111 and the disassembly protruding portion 14112 are configured to press against the first pressed protruding portion 113 of the cage 11. In the same way, the assembly protruding portion 14211 and the disassembly protruding portion 14212 are configured to press against the second pressed protruding portion 114 of the cage 11. Accordingly, the first link 141 and the second link 142 may force the tray 13 to be moved toward or away from the circuit backplate 12.

In addition, a distance L1 between the first end 1421 of the second link 142 and the supporting plate 115 is larger than a distance L2 between the second end 1422 of the second link 142 and the supporting plate 115 and the height H1 of the first pressed protruding portion 113. Thus, when the tray 13 is placed into the mounting space 111 of the cage 11, the interference between the tray 13 and the first pressed protruding portion 113 is prevented.

The handheld link 144 is connected to the first end 1411 of the first link 141 so as to force the first link 141 to rotate relative to the tray 13. The handheld link 144 includes a first extension portion 1441 and a second extension portion 1442. The first extension portion 1441 is connected to the first end 1411 of the first link 141, and is substantially perpendicular to the first link 141. The second extension portion 1442 is connected to the first extension portion 1441, and is substantially perpendicular to the first extension portion 1441. The so-called "substantially perpendicular to" means "completely perpendicular to" or "nearly perpendicular to".

In this embodiment, the storage assembly 10 may include a positioning member 15, and the cage 11 may have two positioning holes 116 spaced apart from the mounting space 111. The positioning member 15 is disposed on the second extension portion 1442 of the handheld link 144, and is configured to be positioned in one of the positioning holes 116 of the cage 11 so as to position the tray 13 and the auxiliary mounting linkage 14.

In this embodiment, the cage 11 may have a blocking rib 117 located in the mounting space 111. The blocking rib 117 is substantially parallel to the circuit backplate 12, and is located on a side of the tray 13 located farthest away from the circuit backplate 12 so as to block the storage device 30. The so-called "substantially parallel to" means "completely parallel to" or "nearly parallel to".

In this embodiment, the cage 11 may have a guiding plate 118 spaced apart from the mounting space 111, and a first guiding protrusion 119. The tray 13 may have a second guiding protrusion 131. The guiding plate 118 is located at the opening 112, and is configured to guide the storage device 30 to be placed into the mounting space 111. The second guiding protrusion 131 is configured to be guided by the first guiding protrusion 119, so that the tray 13 is placed into the mounting space 111 from the opening 112.

In this embodiment, the storage assembly 10 accommodates one storage device 30, and the storage device 30 is disposed on one layer of the cage 11, but the present invention is not limited thereto. In other embodiments, the storage assembly may accommodate two storage devices, and the storage devices are disposed on the different layers, respectively.

In this embodiment, the cage 11 is partitioned into two layers, but the present invention is not limited thereto. In other embodiments, the cage may have one layer merely.

Figure 7:
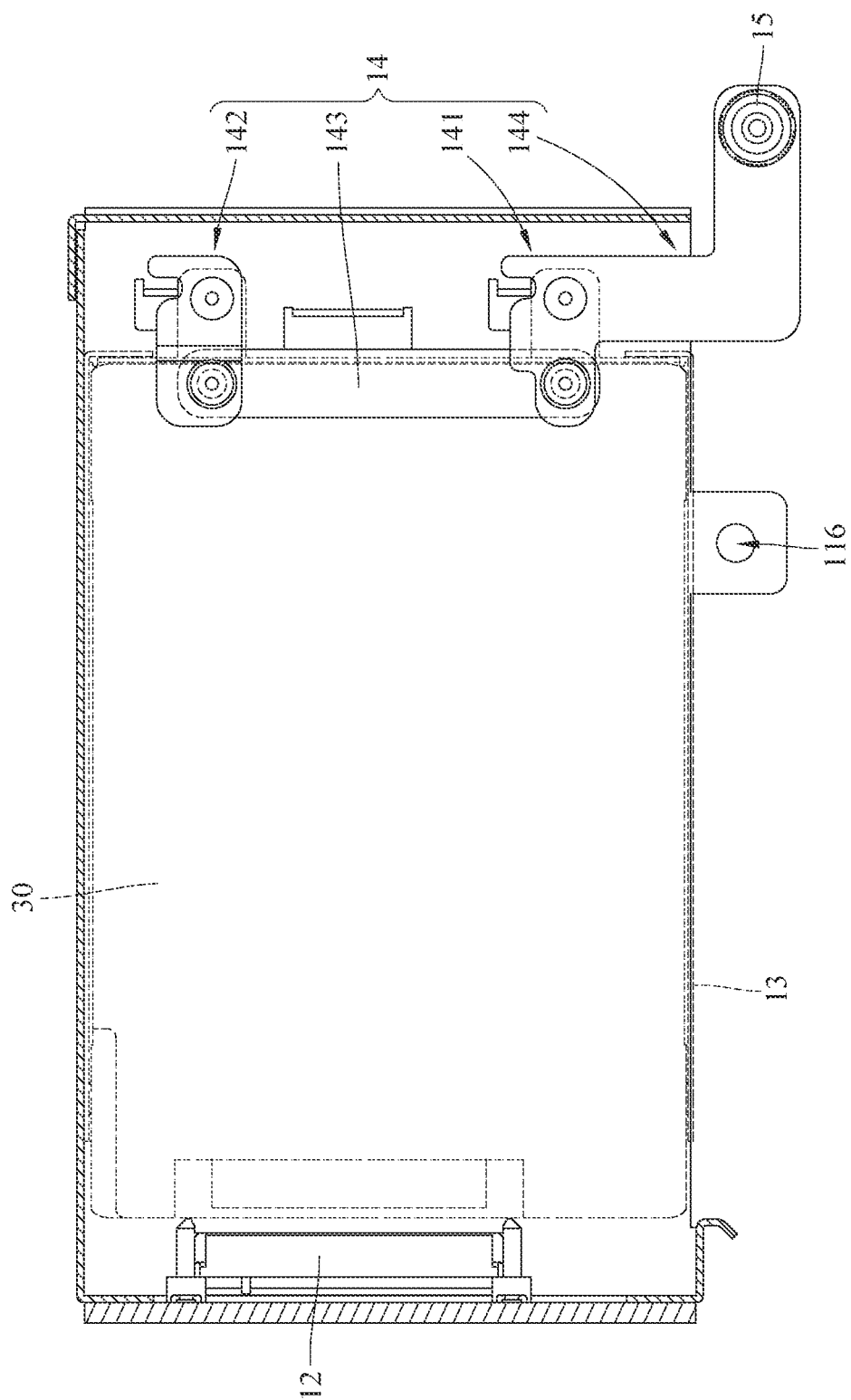
FIG. 7 is a top view showing that a storage device is not plugged into a circuit backplate in FIG. 3.
Figure 8:
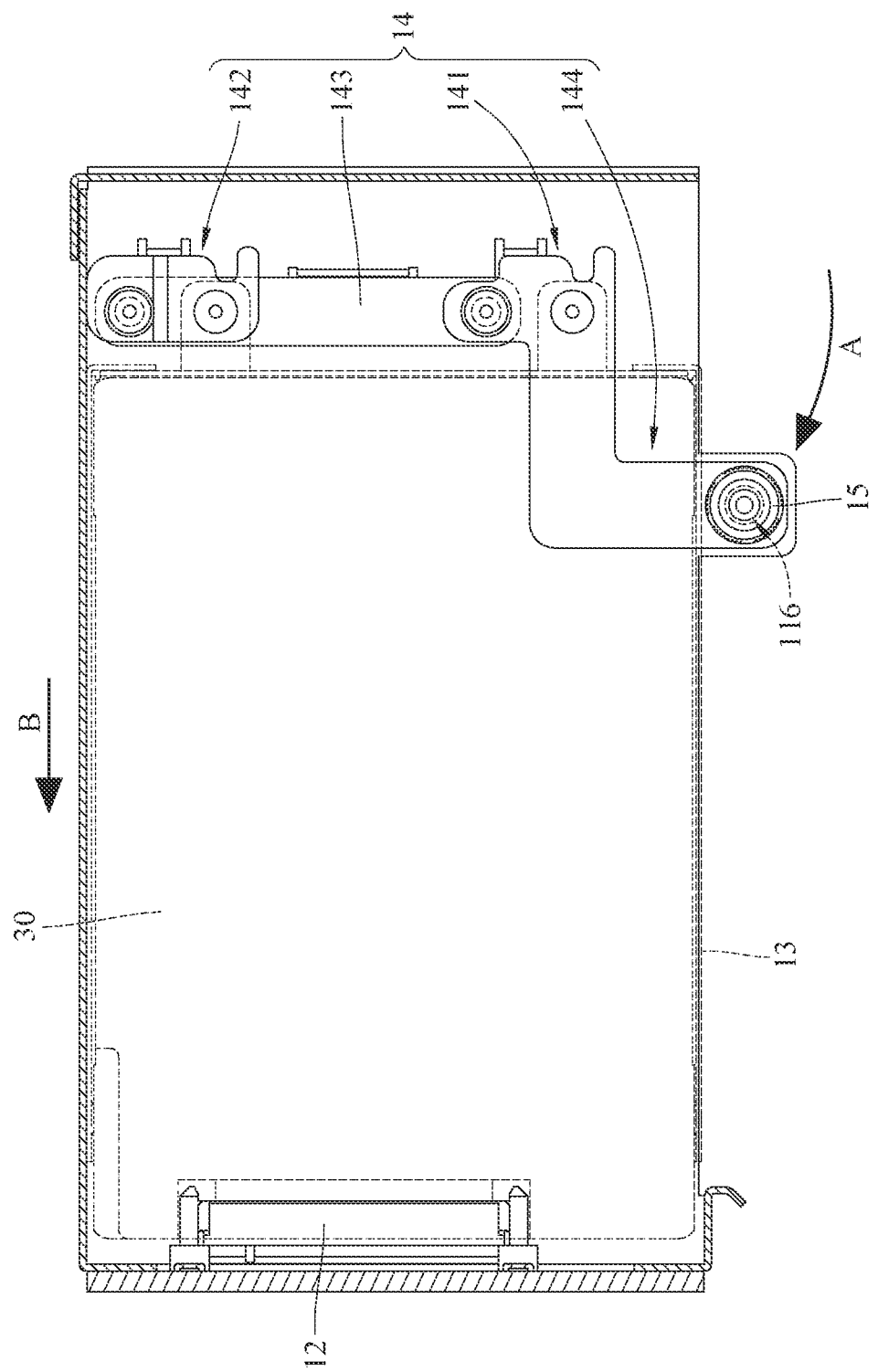
FIG. 8 is a top view showing that the storage device is plugged into the circuit backplate in FIG. 3.
Figure 9:
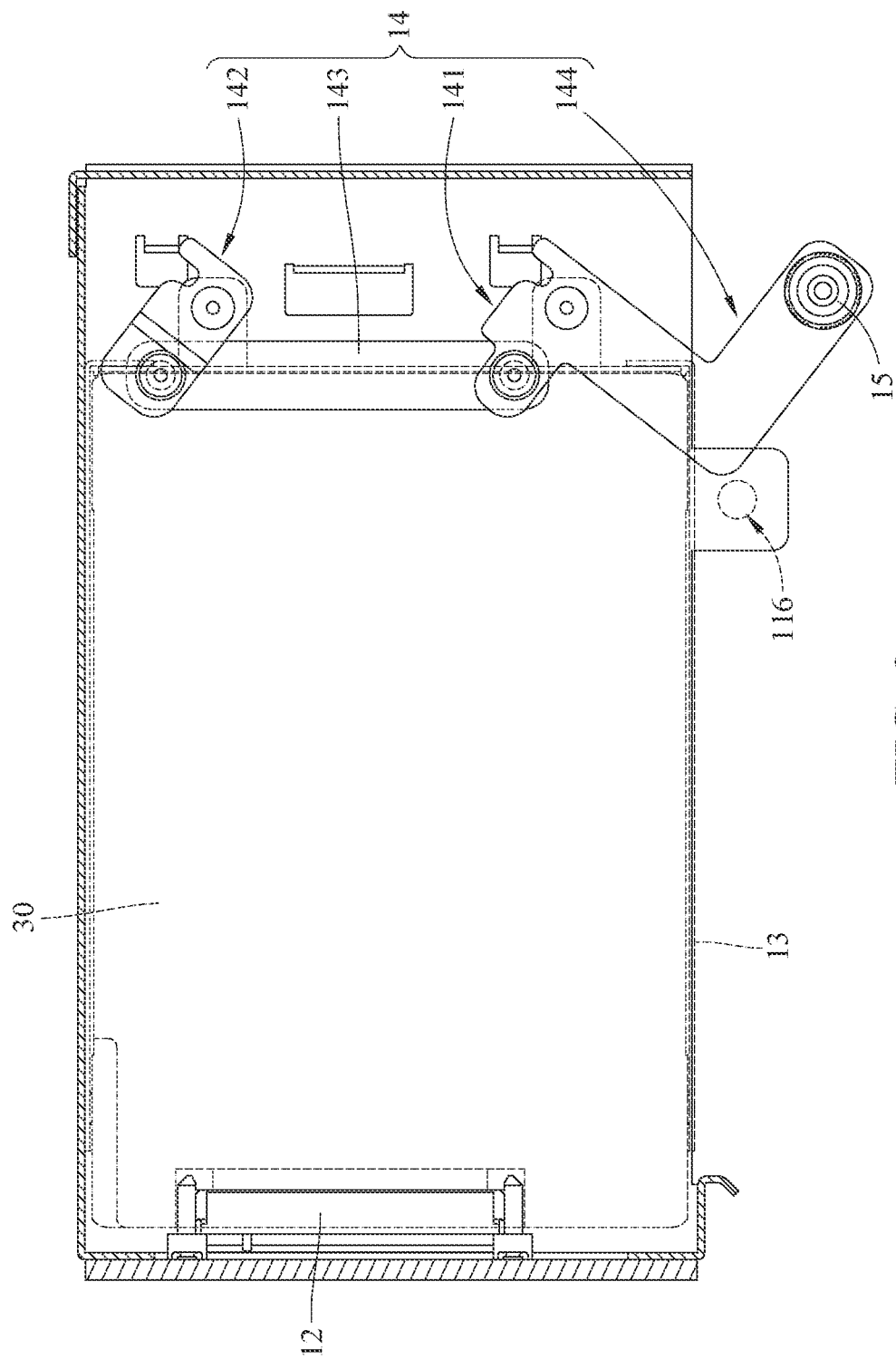
FIG. 9 is a top view showing that an auxiliary mounting linkage of the storage assembly in FIG. 3 is rotated.

Please refer to FIG. 7 to FIG. 9, where FIG. 7 is a top view showing that the storage device 30 is not plugged into the circuit backplate 12 in FIG. 3, FIG. 8 is a top view showing that the storage device 30 is plugged into the circuit backplate 12 in FIG. 3, and FIG. 9 is a top view showing that the auxiliary mounting linkage 14 is rotated at an angle in FIG. 3.

As shown in FIG. 7 and FIG. 8, when the storage device 30 is required to be installed in the storage assembly 10, the storage device 30 is firstly installed on the tray 13, and then the tray 13 is placed into the mounting space 111 of the cage 11 of the storage assembly 10. Then, the handheld link 144 is pushed along a direction A, so that the connecting link 143 forces the first link 141 and the second link 142 to be moved, thereby allowing the assembly protruding portion 14111 of the first link 141 and the assembly protruding portion 14211 of the second link 142 pressing against the first pressed protruding portion 113 and the second pressed protruding portion 114 of the cage 11, respectively, In this way, the storage device 30 is pushed along a direction B. At this time, the storage device is plugged into the circuit backplate 12. Then, the positioning member 15 is positioned in one of the positioning holes 116, so that the storage device 30 is installed in the storage assembly 10.

On the contrary, as shown in FIG. 9, when the storage device 30 is required to be removed from the storage assembly 10, the positioning member 15 is firstly released from one of the positioning holes 116, and the handheld link 144 is pulled along a direction opposite to the direction A, so that the connecting link 143 forces the first link 141 and the second link 142 to be moved, thereby allowing the disassembly protruding portion 14112 of the first link 141 and the disassembly protruding portion 14212 of the second link 142 pressing against the first pressed protruding portion 113 and the second pressed protruding portion 114 of the cage 11, respectively, so as to pull the storage device 30 along a direction opposite to the direction B. At this time, the storage device 30 is unplugged from the circuit backplate 12, and then is released from the storage assembly 10, so that the storage device can be removed from the mounting space 111 of the cage 11 of the storage assembly 10.

According to the storage assembly and the side mounting assembly disclosed by above embodiments, the first link and the second link of the auxiliary mounting linkage force the tray to be moved toward or away from the circuit backplate. That is, the first link and the second link of the auxiliary mounting linkage force the tray to be moved horizontally relative to the cage. Thus, the storage device can be installed on the circuit backplate more conveniently and with less force via the side mounting assembly when the storage device needs to be placed horizontally due to limited space. Therefore, the storage assembly and the side mounting assembly can improve the convenience of installing the storage device in the server.

In this embodiment, the server of the present invention can be applied to artificial intelligence (AI) computing, edge computing, and can also be used as a 5G server, a cloud server or a Vehicles Internet server.

It will be apparent to those skilled in the art that various modifications and variations can be made to the present invention. It is intended that the specification and examples be considered as exemplary embodiments only, with the scope of the invention being indicated by the following claims and their equivalents.

What is claimed is:

1. A storage assembly, configured to install a storage device, wherein the storage assembly comprises:
   a cage, having a mounting space, an opening, a first pressed protruding portion and a blocking rib, wherein the opening is connected to the mounting space, and the first pressed protruding portion and the blocking rib are is located in the mounting space;
   a circuit backplate, disposed on a side of the mounting space, wherein the blocking rib is substantially parallel to the circuit backplate;
   a tray, configured to support the storage device and be removably disposed in the mounting space via the opening, wherein the blocking rib is located on a side of the tray farthest away from the circuit backplate; and
   an auxiliary mounting linkage, comprising a first link, a second link and a connecting link, the first link has a first end and a second end opposite to each other, the second link has a first end and a second end opposite to each other, the first end of the first link and the first end of the second link are pivotally disposed on the tray, two opposite ends of the connecting link are pivotally disposed on the second end of the first link and the second end of the second link, respectively, each of the first end of the first link and the first end of the second link has an assembly protruding portion and a disassembly protruding portion, when the assembly protruding portion of the first link and the assembly protruding portion of the second link press against the first pressed protruding portion of the cage, the first link and the second link force the tray to be moved toward the circuit backplate, when the disassembly protruding portion of the first link and the disassembly protruding portion of the second link press against the first pressed protruding portion of the cage, the first link and the second link force the tray to be moved away from the circuit backplate.

2. The storage assembly according to claim 1, wherein the first link is located closer to the opening than the second link, the auxiliary mounting linkage further comprises a handheld link, the handheld link is connected to the first end of the first link so as to force the first link to be rotated relative to the tray.

3. The storage assembly according to claim 2, wherein the handheld link comprises a first extension portion and a second extension portion, the first extension portion is connected to the first end of the first link, and is substantially perpendicular to the first link, the second extension portion is connected to the first extension portion, and is substantially perpendicular to the first extension portion.

4. The storage assembly according to claim 3, further comprising a positioning member, the cage has a positioning hole spaced apart from the mounting space, the positioning member is located on the second extension portion of the handheld link, and is configured to be positioned in the positioning hole of the cage so as to position the tray and the auxiliary mounting linkage.

5. The storage assembly according to claim 1, wherein the cage further has a guiding plate spaced apart from the mounting space, the guiding plate is located at the opening, and is configured to guide the storage device.

6. The storage assembly according to claim 1, wherein the cage further comprises a second pressed protruding portion, the second pressed protruding portion is located in the mounting space, and is located farther away from the opening than the first pressed protruding portion, a height of the second pressed protruding portion is larger than a height of the first pressed protruding portion, the cage comprises a supporting plate, the supporting plate is configured to support the tray, a distance between the first end of the second link and the supporting plate is larger than a distance between the second end of the second link and the supporting plate and the height of the first pressed protruding portion, and the assembly protruding portion and a disassembly protruding portion of the second link are configured to press against the second pressed protruding portion.

7. The storage assembly according to claim 1, wherein the cage further has a first guiding protrusion, the tray further has a second guiding protrusion, and the second guiding protrusion is configured to be guided by the first guiding protrusion, so that the tray is placed into the mounting space from the opening.

* * * * *